US006897993B2

(12) United States Patent
Steinle

(10) Patent No.: US 6,897,993 B2
(45) Date of Patent: May 24, 2005

(54) ELECTROABSORPTION MODULATOR, MODULATOR LASER DEVICE AND METHOD FOR PRODUCING AN ELECTROABSORPTION MODULATOR

(75) Inventor: Gunther Steinle, Munich (DE)

(73) Assignee: Infineon Technologies AG (DE)

( * ) Notice: Subject to any disclaimer, the term of this patent is extended or adjusted under 35 U.S.C. 154(b) by 18 days.

(21) Appl. No.: 10/202,919

(22) Filed: Jul. 25, 2002

(65) Prior Publication Data

US 2004/0017600 A1 Jan. 29, 2004

(51) Int. Cl.[7] .............................. G02F 1/01; G02F 1/03; G02F 1/07; G02F 1/035; H01L 31/0328
(52) U.S. Cl. ....................... 359/240; 359/248; 257/21; 385/2
(58) Field of Search ................................. 359/240, 245, 359/254, 282, 315, 321, 248; 257/25, 85, 13, 21, 104, 105, 436, 437, 464; 385/1–3, 129, 131, 132

(56) References Cited

U.S. PATENT DOCUMENTS

| 4,872,744 A | * | 10/1989 | Abeles et al. ............... 359/276 |
| 5,637,883 A | * | 6/1997 | Bowman et al. ............... 257/21 |
| 6,198,853 B1 | * | 3/2001 | Yamada ........................... 385/2 |
| 6,271,943 B1 | * | 8/2001 | Goossen ........................... 398/9 |

FOREIGN PATENT DOCUMENTS

| DE | 690 15 228 T2 | 9/1990 |
| DE | 44 29 772 C2 | 2/1995 |
| DE | 692 03 998 T2 | 8/1995 |
| EP | 0 599 826 B1 | 6/1994 |
| EP | 1 069 456 A2 | 1/2001 |

OTHER PUBLICATIONS

P. Steinmann, B. Borchert, B. Stegmuller: Improved Behavior of monolithically integrated laser/modulator by modified identical active layer structure. IEEE Photonics Technol. Let., vol. 9, No. 12, pp. 1561–1563, 1997.

S.F. Lim, J.A. Hudgings, L.P. Chen, G.S. Li. W. Yuen, K.Y. Lau, C.J. Chang–Hasnain: Modulation of a Vertical–Cavity Surface–Emitting Laser using an Intracavity Quantum Well Absorber. IEEE Photonics Technol. Lett., vol. 10, No. 3, pp. 319–321, 1998.

(Continued)

*Primary Examiner*—Hung Xuan Dang
*Assistant Examiner*—Joseph Martinez
(74) *Attorney, Agent, or Firm*—Altera Law Group, LLC; Jeffrey R. Stone

(57) ABSTRACT

Electroabsorption modulator (100) having a layer sequence of at least five sequential layers, having at least one light absorption layer (106) which is arranged between the first layer (101) and the third layer (102) and is set up to generate charge carriers upon irradiation of light (108) of a specific wavelength, and having at least one storage layer (104) which is arranged between the third layer (102) and the fifth layer (103) and is set up to store charge carriers.

13 Claims, 7 Drawing Sheets

OTHER PUBLICATIONS

J.A. Hudgings, R.J. Stone, C.H. Chang: Dynamic Behavior and Applications of a Three-Contact Vertical-Cavity Surface-Emitting Laser. IEEE J. of Sel. Topics in Quantum Electronics, vol. 5, No. 3, pp. 512-519, 1999.

P.J. Bradley, C. Rigo, A. Stano: Carrier Induced Transient Electric Fields in a p-i-n InP-InGaAs Multiple-Quantum-Well Modulator. IEEE J. of Quantum Electronics, vol. 32, No. 1, pp. 43-52, 1996.

K.W. Jelley, R.W.H. Engelmann, K. Alavi, H. Lee: Well Size Related Limitations on Maximum Electroabsorption in GaAs/AlGaAs Multiple Quantum Well Structures. Appl Phys. Lett., vol. 55, No. 1, pp. 70-72, 1989.

M. Preisel, J. Mork: Phonon-mediated carrier capture in quantum well lasers. J. Appl. Phys., vol. 76, No. 3, pp. 1691-1696, 1994.

M. Wegener, J.E. Zucker, T.Y. Chang, N.J. Sauer, K.L. Jones, D.S. Chemla, Absorption and Refraction Spectroscopy of a Tunable-Electron-Density Quantum-Well and Resevoir Structure. Phys. Rev. B, vol. 41, No. 5, pp. 3097-3104, 1990.

J. Wang, J.P. Leburton, J.L. Educato, J.E. Zucker: Speed Response Analysis of an Electron-Transfer Multiple-Quantum-Well Waveguide Modulator. J. Appl. Phys., vol. 73, No. 9, pp. 4669-4679, 1993.

N. Agrawal, M. Wegener: Ultrafast Graded-Gap Electron Transfer Optical Modulator Structure. Appl. Phys. Lett., vol. 65, No. 6, pp. 685-687, 1994.

* cited by examiner

ELECTROABSORPTION MODULATOR, MODULATOR LASER DEVICE AND METHOD FOR PRODUCING AN ELECTROABSORPTION MODULATOR

BACKGROUND OF THE INVENTION

1. Field of the Invention

The invention relates to an electroabsorption modulator, a modulator laser device and a method for producing an electroabsorption modulator.

Semiconductor laser diodes which are used as transmitting elements in optical telecommunications must simultaneously fulfill a plurality of requirements which can, however, be optimized only in dependence on one another. For example, in the case of a direct modulation in a semiconductor laser diode, only a high current density or a high internal light intensity ensures a fast intrinsic modulability, but at the same time parasitic effects such as parasitic resistances, parasitic capacitances and parasitic inductances in the supply leads should be minimized, and the internal heating of the component should be limited. This can be achieved with the aid of an optical modulator driven separately electrically. Specifically in the case of a laser structure in which the resonator fixes the wavelength—for example in the case of a distributed feedback laser (DFB laser) or a vertical-cavity surface-emitting laser (VCSEL), the relative displacement of the laser wavelength and the absorption edge with temperature mostly ensures a narrow temperature window in which the modulation principle functions.

It is therefore desirable to have a modulator which can be used in a wide spectral and temperature range. Moreover, it is also desirable for the transmission of digital signals likewise to have a digital modulation principle in which the optical modulator can assume only two states, for example absorbing ("off" state) and poorly or non-absorbing ("on" state), and these states cannot be influenced by the preceding signal sequence.

If, for example, the active surface of the laser is reduced, a high current density and a fast modulability together with a limited thermal heating of the laser are achieved with small currents through the active surface. At the same time, however, the series resistance grows because of the current constriction. In conjunction with existing non-scalable capacitances at the connecting contacts (pads) and in the driver circuit, this leads to an undesired additional RC limitation of the modulability.

An external modulator is normally used, first and foremost, in telecommunications applications. However, this is expensive in the datacom sector and would precisely nullify the advantage of an inexpensive laser diode, for example a vertical emitter. By contrast, because of the required compactness, in the case of integrated modulators use is predominantly made of direct modulation of the imaginary part of the refractive index in so-called electroabsorption modulators.

2. Description of the Related Prior Art

Laser diodes with a monolithically integrated electroabsorption modulator are already known from the prior art, for example from [1], [2] or [3]. In this case, for example, the Quantum Confined Stark Effect, shortened below to QCSE, is utilized in order to displace the absorption edge in the modulator and thereby to switch the modulator to and from between the "off" state and the "on" state. With such a modulator it is only the efficiency of the charge carrier removal, that is to say the charge carrier emission from the quantum wells and the drift over the field region, which limits the intrinsic speed by analogy with photodetectors. It is disclosed in [4] in this context that filling effects and changes in the local electric field should be avoided because of their strong effects on the optical properties.

A substantial disadvantage of this modulation principle is, however, the limited effect of the displacement of the quantum well band gap or of the fundamental exciton absorption concerned as a function of the applied field. In the case of a typical VCSEL structure, which should be operated uncooled between 0° C. and 85° C., the relative displacement between maximum gain and emission energy is approximately 30 meV. Moreover, a deviation of up to ±10 meV between laser resonance and modulator band gap should also be permitted in order to be able to compensate layer thickness tolerances between the individual components.

In order in an appropriate modulator quantum well to adapt only the band gap or fundamental exciton absorption line by the overall amount set forth above in relation to the resonator wavelength, an absorption edge displacement of 50 meV will already need to be achieved via the change in bias. According to [5], the realistically achievable displacement is approximately half as large. The fields required for this purpose of the level of a few $10^5$ V/m would lead to dissociation of the excitons, and the modulation characteristic would not be uniform in the overall operating range. In addition, for a given voltage range the large field region in the system limits the length of the intrinsic region and thus the minimization of the capacitance.

Moreover, nonlinear effects such as impact ionization are also to be considered. For GaAs, the ionization coefficient for electrons is just $10^4$/cm at 250 kV/cm. Consequently, electroabsorption modulators which use the QCSE can be used without a problem only in temperature-controlled systems with defined detuning of the resonator wavelength on the one hand, and between the gain and absorption spectra of the active regions, on the other hand.

By contrast with the QCSE modulator, in the case of a modulator which operates with charge carrier filling, when it is switched into the transparent state, the charge carriers are firstly transported to the quantum well and then captured there. Consequently, in the case of this modulator type both the charge carrier emission process and the charge carrier capture process form the fundamental speed limitations. The charge carrier capture in quantum wells with good charge carrier inclusion proceeds yet more quickly than the charge carrier emission and is of the order of magnitude of $10^{-12}$ in accordance with [6].

Neither capture nor emission times would be a fundamental limitation for targeted modulation frequencies up to 40 GHz, since these can be kept shorter than 5 ps by means of a favorable quantum well design and, in the case of the emission time, by means of correspondingly high fields. However, this holds only as long as the charge carrier recombination which is slower by several orders of magnitude is not used for switching, and as long as the charge carrier transport by means of drift or diffusion is fast enough. In the case of a pin quantum well structure being forwardly polarized, transport on the undoped barriers at low carrier densities essentially only takes place by means of diffusion. A pin quantum well structure is to be understood in this case as a quantum well structure of a strongly doped p-region, a strongly doped n-region and an intrinsic region lying therebetween.

The diffusion time for holes is determined in accordance with $\tau_{diff}=L_i^2/4D_h$. In the case of an assumed spacing of the quantum well from the p-doped region of $L_i$=100 nm and a diffusion constant at room temperature of $D_h=kT\mu_h/q$=5 cm$^2$/s for $Al_{0.2}Ga_{0.8}As$, this results in such a case in a transport time of approximately 5 ps, but this grows quadratically with the diffusion length. Depending on the quantum well design and doping profile, thus, it is either the transport time or the physical capture time which predominates.

If the undoped diffusion regions are reduced, the capacitance is increased, however. This has a disadvantageous effect on the modulation rate if the charge carriers need to be removed from the quantum well again not, as in the laser, already by means of stimulated recombination, but only by means of a change in the external voltage. In this case, the space charge capacitance in series with the bulk resistance leads to an RC limitation of the modulation bandwidth. The intrinsic series resistance is determined chiefly by the p-doped lead layer on the basis of the low hole mobility in semiconductor materials. Consequently, it would be desirable to have a concept which permits optimum setting of capacitance, transport times and bulk resistance depending on semiconductor material used, modulated design and parasiticities of the lead and/or drive. Thus, the bulk resistance can be substantially reduced, for example, when exclusively n-doped lead layers are used.

Such a modulation principle, which comprises nipin-structures (structures composed of a layer stack of n-doped layer, intrinsic layer, p-doped layer, intrinsic layer and n-doped layer) and operates chiefly with electron filling into a quantum well from a neighboring n-doped heterobarrier (reservoir), has become known under the designation BRAQWET (Barrier Reservoir And Quantum-Well Electron-Transfer) (compare [7]). In accordance with the BRAQWET, the so-called Burstein-Moss-effect is used, that is to say the reduction of the absorption by filling only one sort of charge carrier into the quantum well. Since the state density of the conduction band is normally substantially smaller than that of the valence band, the quantum well is filled with electrons.

Consequently, degeneracy is achieved as early as with a low charge carrier density of approximately $2\times10^{18}$ cm$^{-3}$, and absorption saturation in the region of the band edge, on the basis of the Pauli exclusion principle. The advantage is that the absorption profile can be displaced both in frequency by means of the QCSE, and also in amplitude by means of filling. Consequently, an increase in the field leads in both cases to increasing the absorption. The electron transport times are generally negligible. However, the structures have some disadvantages. Because of the need to optimize electron filling, operations should be conducted with sufficiently high diffusion barriers relative to the electron reservoir. In accordance with [8], this in turn limits the electron emission rate upon switching over to maximum absorption. The effective barrier height is lowered with high fields, if appropriate. Furthermore, it is known in accordance with the prior art to render the reservoir barrier continuous, it thereby being possible to shorten the electron emission times virtually at will. However, in principle this is done at the cost of the electron inclusion. However, the pump-probe measurements published in [9] exhibit no worsening in the electrooptical properties. In the case of optical excitation, however, long effective hole emission times were observed in the nanosecond region. The barrier height on the extraction side for holes is very high in BRAQWETs, in order to configure the electron filling efficiently and with a low leakage current. The negative effect of the field shielding of remaining holes is not yet explained in this case. In general, it is either possible for a given voltage shift to maximize the absorption shift into a larger spectral range, or to optimize rate. Furthermore, in the case of unipolar filling the state of transparency cannot be completely achieved, and the absorption shift is still a function of temperature, although the spectral dependence of the absorption shift is already reduced by contrast with pure QCSE modulators.

In addition, only a quantum well can be filled efficiently in unipolar fashion per npn region. Consequently, several absorption regions are mostly arranged one above another. In accordance with [7], this multiplies the voltage requirement. During a lengthy "on" state (absorption minimum in the modulator), by contrast, a state of transparency is achieved nevertheless because of the generation of holes on the basis of the non-vanishing absorption. On the one hand, the modulation depth is thereby a function of the bit sequence, while on the other hand the plasma then produced must be removed from the pn junction or the quantum well. This does lead, finally, to an increased space charge capacitance.

Consequently, the respective other charge carrier type, which necessarily arises upon absorption, should be efficiently swept out even in the case of a theoretically pure absorber operating in a unipolar fashion.

Disclosed in [10] is an optical electroabsorption modulator in which a first upper cladding layer and a second upper cladding layer are provided over an optical absorption layer. Provided between the first upper cladding layer and the second upper cladding layer is a barrier layer which is provided for the purpose of preventing a diffusion of foreign atoms from the second upper cladding layer or thereabove into the first upper cladding layer and the optical absorption layer.

A monolithically integrated laser diode modulator with a strongly coupled super-lattice is disclosed in [11]. In this laser diode modulator, the same epitaxial layer, specifically a strongly coupled, combined super-lattice, is used as active layer of the laser diode and as absorbing layer of the modulator.

[12] discloses an integrated modulator semiconductor laser device which is produced on a semiconductor wafer by means of selective crystal growth. For this purpose, each chip region on the semiconductor wafer is divided into two semiconductor regions. There is produced on each first semiconductor region a semiconductor laser which can emit laser light, and there is produced on each second semiconductor region a light modulator which can modulate the intensity of the laser light emitted by the semiconductor laser.

A semiconductor device with cascade-modulation-doped quantum well heterostructures is disclosed in [13]. In this semiconductor device, known modulation-doped quantum well heterostructures are cascaded in order to increase the rate of functioning without significantly increasing the operating potentials.

Moreover, [14] discloses a semiconductor device with polarization-independent stacked heterostructure, which is similar in its design to the semiconductor device known from [13].

BRIEF SUMMARY OF THE INVENTION

The invention is therefore based on the problem of specifying an electroabsorption modulator, a modulator laser device and a method for producing an electroabsorption modulator, in the case of which modulator/device the modulator can be used in a wide spectral and temperature range and has fast switching times.

The problem is solved by means of an electroabsorption modulator, a modulator laser device and a method for producing an electroabsorption modulator with the aid of the features in accordance with the independent patent claims.

An electroabsorption modulator comprises a layer sequence of at least five layers, the layer sequence having sequentially a first layer with excess charge carriers of a first charge carrier type, a second layer without excess charge carriers, a third layer with excess charge carriers of a second charge carrier type, a fourth layer without excess charge carriers, and a fifth layer with excess charge carriers of the first charge carrier type. Arranged between the first layer and the third layer is at least one light absorption layer which can generate charge carriers upon irradiation of light of a specific wavelength. Arranged between the third layer and the fifth layer is at least one storage layer which is set up to store charge carriers.

A modulator laser device comprises a semiconductor laser and an electroabsorption modulator. The electroabsorption modulator comprises, for example, a layer sequence of at least five layers, the layer sequence having sequentially a first layer with excess charge carriers of a first charge carrier type, a second layer without excess charge carriers, a third layer with excess charge carriers of a second charge carrier type, a fourth layer without excess charge carriers, and a fifth layer with excess charge carriers of the first charge carrier type. Arranged between the first layer and the third layer is at least one light absorption layer, which can generate charge carriers upon irradiation of light of a specific wavelength. Arranged between the third layer and the fifth layer is at least one storage layer which is set up to store charge carriers. The electroabsorption modulator and the semiconductor laser are arranged in such a way that the electroabsorption modulator can transmit or absorb light emitted by the semiconductor laser.

In the case of a method for producing an electroabsorption modulator, a layer sequence of at least five sequential layers is produced on a substrate. Excess charge carriers of a first charge carrier type are introduced into the first layer and into the fifth layer of the layer sequence. Excess charge carriers of a second charge carrier type are introduced into the third layer of the layer sequence. By contrast, no excess charge carriers are introduced into the second layer and into the fourth layer of the layer sequence. Both the first layer and the fifth layer of the layer sequence are electrically coupled to in each case at least one electric connection in order to form an electroabsorption modulator.

One advantage of the invention can be seen in that the electroabsorption modulator is clearly a Bipolar Quantum Reservoir Electroabsorption Modulator (BIPQREAM) with an npn or a pnp arrangement. Both electrons and holes (therefore the designation "bipolar") are filled into the absorbing region of the electroabsorption modulator. This leads to a large modulation range between maximum absorption in the swept-out state, that is to say without charge carrier filling in the absorber region, and virtually vanishing absorption in the filled state, that is to say with charge carrier filling in the absorber region. In this case, the modulation range is largely insensitive to spectral and/or temperature fluctuations. The state of maximum absorption is denoted below as "off" state, and the state of minimum absorption as transparency state or "on" state.

A further advantage of the invention is the fact that a quantum reservoir is used for storing the charge carriers. This ensures that the maximum modulation shift is reached quickly, since the charge carriers need not be generated each time by absorption of the laser light. In addition, the finite lifetime in the reservoir quantum films ensures a limitation of the quantity of moving charge carriers, and thus of the effective capacitance. It always blocks one of the two pn junctions, for which reason no external current is generated. The charge carrier quantity is automatically controlled during the transparency states, since the charge carrier density in the absorption regions is held just below the respective transparency density dependent on the laser wavelength, because of the type and number of quantum films. The remaining absorption is just so large that it is possible to compensate unavoidable charge carrier losses, chiefly non-radiating and spontaneous recombination in the absorber quantum films.

When a switchover is made into the absorption state, the charge carriers are transferred onto the reservoir region. In the case of long absorption times, a permanent filling of the reservoir quantum films is performed from the photocurrent of the modulator quantum wells, which is fed either by a non-vanishing laser signal or—in the special case of pure Q-switching—by the remaining spontaneous emission of the laser.

The number of stored charge carriers is limited because of recombination in the reservoir quantum wells. In order to avoid a modulation efficiency dependent on the bit sequence, the type and number of reservoir quantum films should be selected in such a way that the maximum charge carrier quantity is somewhat greater than the quantity required at least for the modulation, and that the latter can be kept even in the case of long "off" states. Possible excess charge carriers are automatically released again to the rising laser field when a switchover is made to "transparent".

The limitation of the charge carrier quantity in this case limits the maximum effective capacitance. The charge reversal of the quantum wells is performed by means of charge carrier drift and by means of diffusion during filling in the respectively forwardly polarized pn junction. The maximum rate is substantially determined by the combined diffusion and capture time and by the charge carrier emission time. The absorption shift can be adapted within a single npn structure by means of the number of quantum wells. Since the absorption in the case of each switching operation changes between maximum (swept-out absorber quantum wells) and vanishing (filled absorber quantum wells), the absorption shift is not in principle a function of the bit sequence. The only variable dependent on the bit sequence is, as described above, the additional space charge capacitance, on the basis of the charge carrier excess after long absorption states. However, it is bounded above by the lifetime of the charge carriers in the reservoir quantum wells.

In the electroabsorption modulator according to the invention, use is made for the first time of a bipolar charge carrier filling in order to achieve the largest possible absorption shift in conjunction with the smallest possible spectral sensitivity. In this case, there is neither a need for a biasing current, nor does a rate-limiting recombination occur. The charge carrier quantity required for switching is provided by an appropriate quantum reservoir, which makes scarcely any contribution to the absorption, and is simultaneously bounded above. This permits a very far reaching digital modulation, in which the two optical states are strongly dependent neither on the signal sequence nor on the level of the input signal.

The first layer, the third layer and the fifth layer of the layer sequence of the electroabsorption modulator according to the invention are preferably appropriately doped to generate the respective excess charge carriers. Alternatively, the excess charge carriers can also be generated in the respective layers by means of applying appropriate voltages or electromagnetic fields.

In a preferred development of the electroabsorption modulator according to the invention, the light absorption layer and the storage layer each have at least one at least one-dimensional quantum system. For example, a layer with embedded quantum points, a layer with at least one quantum wire or a layer made of at least one quantum film can be used as quantum system.

The first layer, the third layer or the fifth layer of the electroabsorption modulator according to the invention, or an arbitrary combination of these layers preferably has/have at least one laterally extended insulating layer with a central opening. On the one hand, this limits the current flow through the layer sequence of the electroabsorption modulator and thus the active modulator region in which the laser light to be modulated overlaps with the modulator region. For this purpose, the first layer and the fifth layer of the layer sequence of the electroabsorption modulator are preferably electrically coupled in each case to an electrode. On the other hand, the insulating layer reduces the overall capacitance of the electroabsorption modulator, since the reactive current fraction in the electroabsorption modulator is lower. In this case, the insulating layer is preferably sheathed by the third layer of the electroabsorption modulator. For example, the insulating layer can then be an oxidized region of the third layer.

In a preferred development of the modulator laser device according to the invention, the semiconductor laser and the electroabsorption modulator have at least one common electrically conductive connecting layer. In this case, this can be set up in such a way that a common current flow is avoided both through the electroabsorption modulator and through the semiconductor laser. It is thereby possible to achieve a satisfactory decoupling of the electroabsorption modulator from the semiconductor laser.

The electroabsorption modulator and the semiconductor laser are preferably monolithically integrated on a semiconductor substrate in the modulator laser device according to the invention. The modulator laser device is therefore a cost-effective component for the datacom sector up to 40 Gbits, which requires no expensive cooling device. For example, the semiconductor laser can be a vertically emitting laser, the electroabsorption modulator and the semiconductor laser then being arranged vertically above one another in the modulator laser device. Alternatively, an edge-emitting laser can be used as semiconductor laser, the electroabsorption modulator and the semiconductor laser being arranged laterally next to one another. If an edge-emitting laser is used as a semiconductor laser, the latter preferably has a resonator based on Bragg structures.

The invention therefore constitutes a temperature-noncritical optical electroabsorption modulator which also operates digitally in a specific embodiment.

Exemplary embodiments of the invention are illustrated in the figures and will be explained in more detail below. In this case, like reference symbols designate like components.

DETAILED DESCRIPTION OF THE INVENTION

Figure 1:
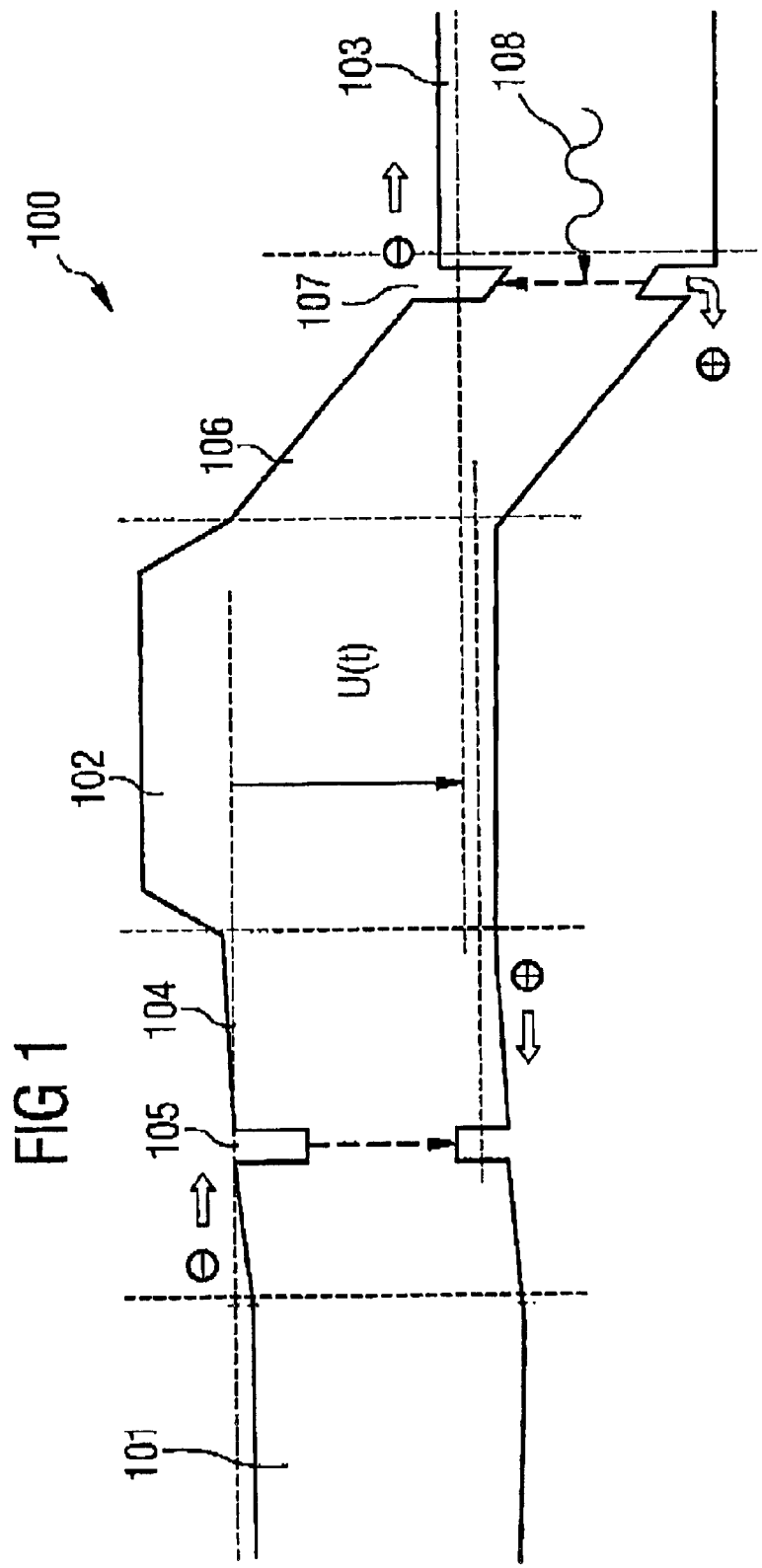
FIG. 1 shows a schematic diagram of the energy bands of an electroabsorption modulator in accordance with a first exemplary embodiment of the invention.

FIG. 1 shows a schematic diagram 100 of the energy bands of an electroabsorption modulator in accordance with a first exemplary embodiment of the invention.

The diagram 100 of the energy bands illustrates the active modulator region of the electroabsorption modulator in the absorbing ("off") state. The electroabsorption modulator comprises a layer sequence of a first n-doped outer lead layer 101, a first undoped, intrinsic intermediate layer which forms the reservoir region 104, a p-doped middle layer 102, a second undoped, intrinsic intermediate layer, which forms the absorber region 106, and a second n-doped outer lead layer 103. The first n-doped outer lead layer 101 forms a first pn junction together with the middle layer 102, and the second n-doped outer lead layer 103 forms a second pn junction with the middle layer 102.

The first pn junction is forward-biased, while the second pn junction is reverse-biased. The forward-biased first pn junction therefore constitutes the reservoir region 104, while the reverse-biased second pn junction constitutes the absorber region 106. A reservoir quantum film 105 is arranged in the reservoir region 104, and an absorber quantum film 107 is arranged in the absorber region 106. Use is made for the middle layer 102 of a material which has a higher band gap than the material for the first or second n-doped outer lead layer 101, 103, respectively. Electron leakage currents from the forward-biased first pn junction into the reverse-biased second pn junction are thereby reduced. This clearly means that the middle layer 102 substantially reduces an electron flow from the reservoir region 105 into the absorber region 107.

As long as the electroabsorption modulator is in the absorbing state, incident laser light 108 is converted in the absorber quantum film 107 of the absorber region 106 into charge carrier pairs. The positively charged holes (defect electrons) migrate owing to charge carrier drift into the middle layer 102 and finally fill the reservoir quantum film 105 in the reservoir region 104 by means of diffusion. The quantity of electrons which corresponds to the holes flows off via the second n-doped outer lead layer 103, and induces a photocurrent between the second n-doped outer lead layer 103 and the first n-doped outer lead layer 101, when the first n-doped outer lead layer 101 and the second n-doped outer lead layer 103 are coupled to one another by means of an outer electric circuit.

The fundamental absorption edge of the absorber quantum film 107 is set in such a way that the incident laser light 108 is efficiently absorbed at all operating temperatures. The band gap of the reservoir quantum film 105 is selected either to be greater or to be smaller than the band gap of the absorber quantum film 107. If the band gap of the reservoir quantum film 105 is greater than the band gap of the absorber quantum film 107, a short circuit of the electroabsorption modulator (U(t)=0) leads automatically to the transparent state ("on" state) of the electroabsorption modulator, since all generated charge carriers predominantly remain in the absorber quantum film 107. If the band gap of the reservoir quantum film 105 is smaller than the band gap of the absorber quantum film 107, a short circuit of the electroabsorption modulator (U(t)=0) leads to the absorption state ("off" state) of the electroabsorption modulator owing to the separation of the generated charge carriers, as a result of which a non-vanishing outer short circuit photocurrent flows. In this case, the optical filling factor of the reservoir quantum film 105 can be selected to be smaller than for the absorber quantum film 107, in order to reduce the absorption of the incident laser light 108 in the reservoir quantum film 105. If the filling factors, that is to say the probabilities for the absorption of a photon of the incident laser light 108, are similar for the reservoir region 104 and the absorber region 106, it is also possible to carry out a frequency doubling by means of the electroabsorption modulator, since then both quantum films 105, 107 operate alternately as reservoir and as absorber.

The electroabsorption modulator illustrated by means of the diagram 100 is an npn structure in which electrons are used to switch the absorber region 106. If, instead of this, recourse is made to a pnp structure, holes are used to switch the absorber region 106.

Figure 2:
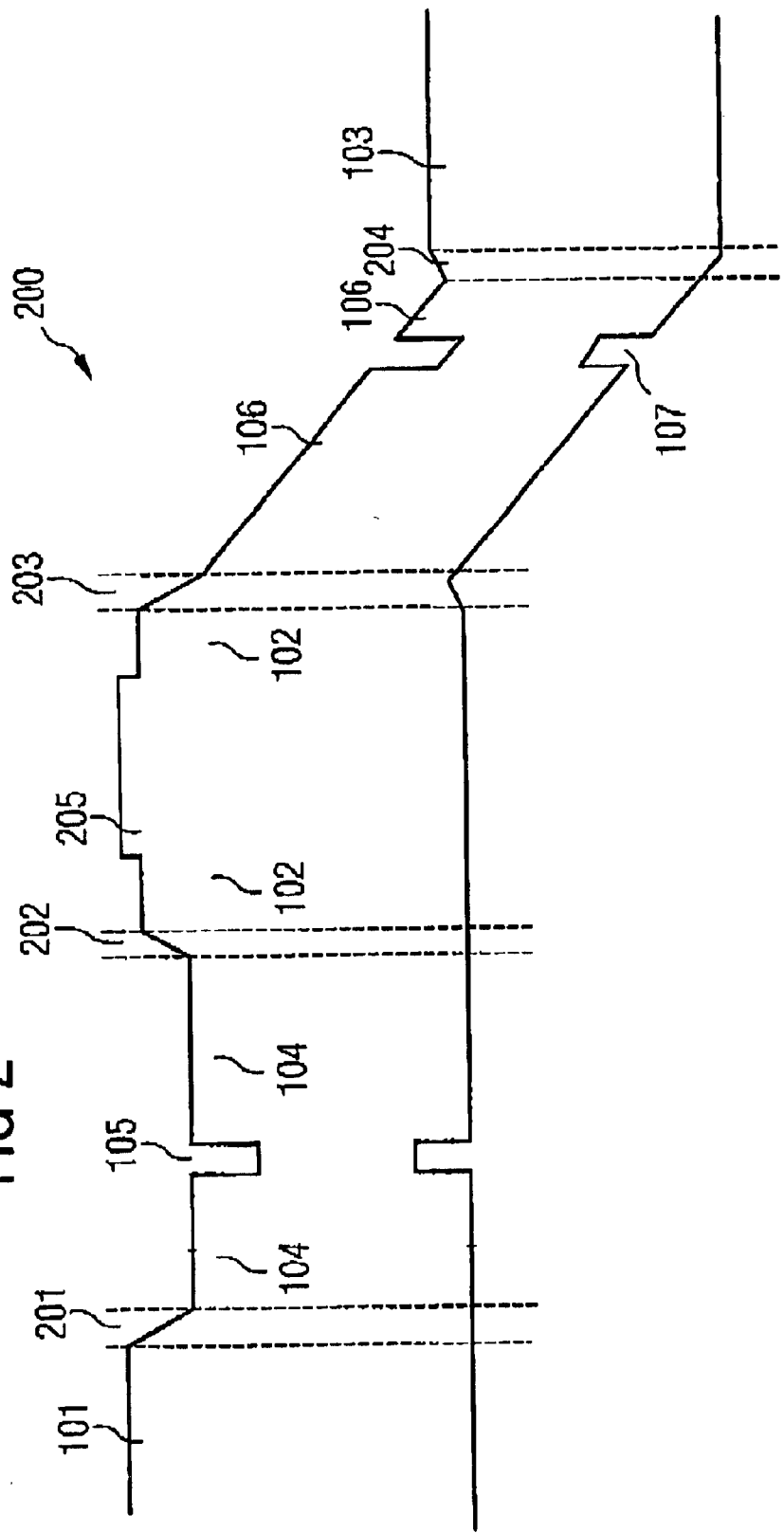
FIG. 2 shows a schematic diagram of the energy bands of an electroabsorption modulator in accordance with a second exemplary embodiment of the invention.

A schematic diagram 200 of the energy bands of an electroabsorption modulator in accordance with a second exemplary embodiment of the invention is illustrated in FIG. 2.

By contrast with FIG. 1, apart from the p-doped middle layer 102, the two n-doped outer lead layers 101, 103 also have a material with a higher band gap, in order to reduce the hole leakage currents. This is particularly sensible whenever very flat quantum films with a low valence band offset are used as reservoir quantum film 105 and as absorber quantum film 107. All layer junctions, also termed heterobarriers, are implemented by means of suitably doped variation layers 201, 202, 203 and 204, such that the respective majority charge carriers perceive a negligibly small electric resistance. The variation layers 201, 202, 203, 204 comprise a continuous variation in the doping profile. Furthermore, the variation layers 201, 202, 203, 204 in accordance with this exemplary embodiment of the invention comprise a layer thickness of 9 nm in each case.

Figure 4:
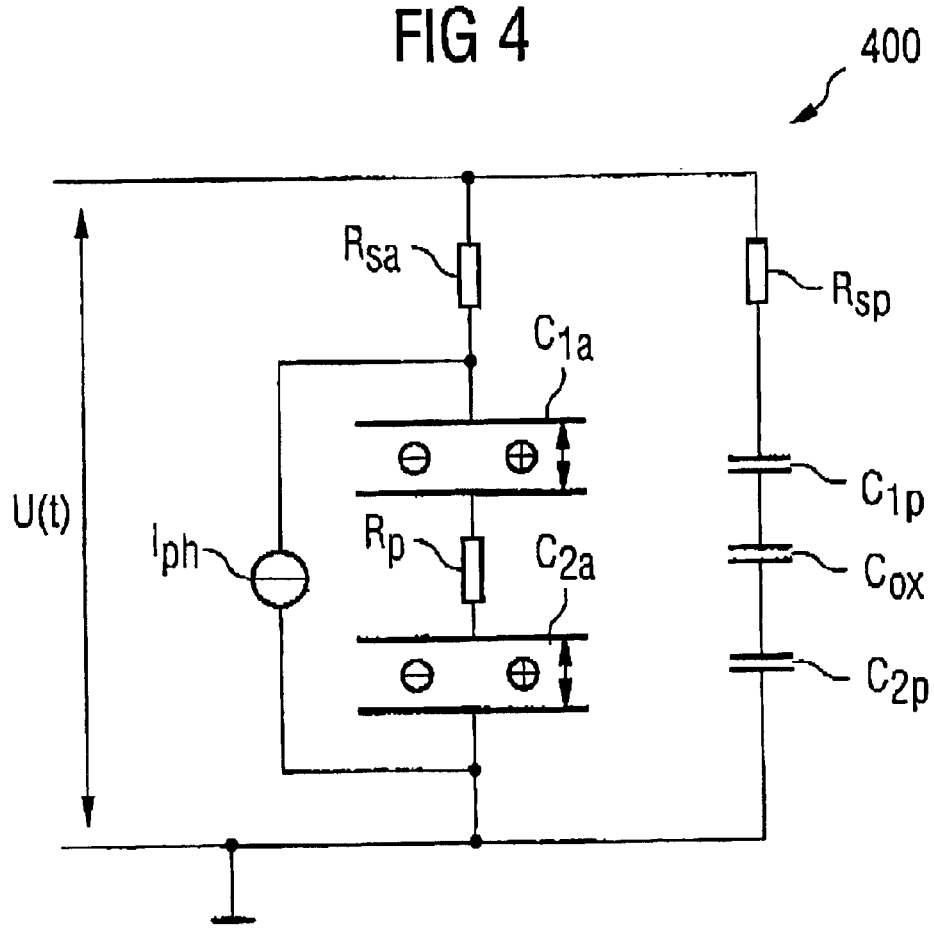
FIG. 4 shows an equivalent electric circuit diagram for an electroabsorption modulator in accordance with the second exemplary embodiment.

Furthermore, the diagram 200 shows the use of a selectively oxidizable layer 205 within the middle layer 102. In the preferred material system $Al_xIn_yGa_{1-x-y}As_{1-m-n}Sb_mN_n$ for growing on GaAs substrates, such a selectively oxidizable layer 205 usually comprises a very high aluminum content of x>0.8. Alternatively, it is also possible to grow a layer sequence of thin super-lattice layers, of which at least one individual layer should then have a correspondingly high aluminum content. During the production of the selectively oxidizable layer 205, the selective oxidation is stopped in good time in order no longer to oxidize the active modulator region, which has a substantial overlap with the laser light. A reduction in the effective modulator capacitance is achieved by means of the selectively oxidizable layer 205, as is illustrated in FIG. 4.

Figure 3:
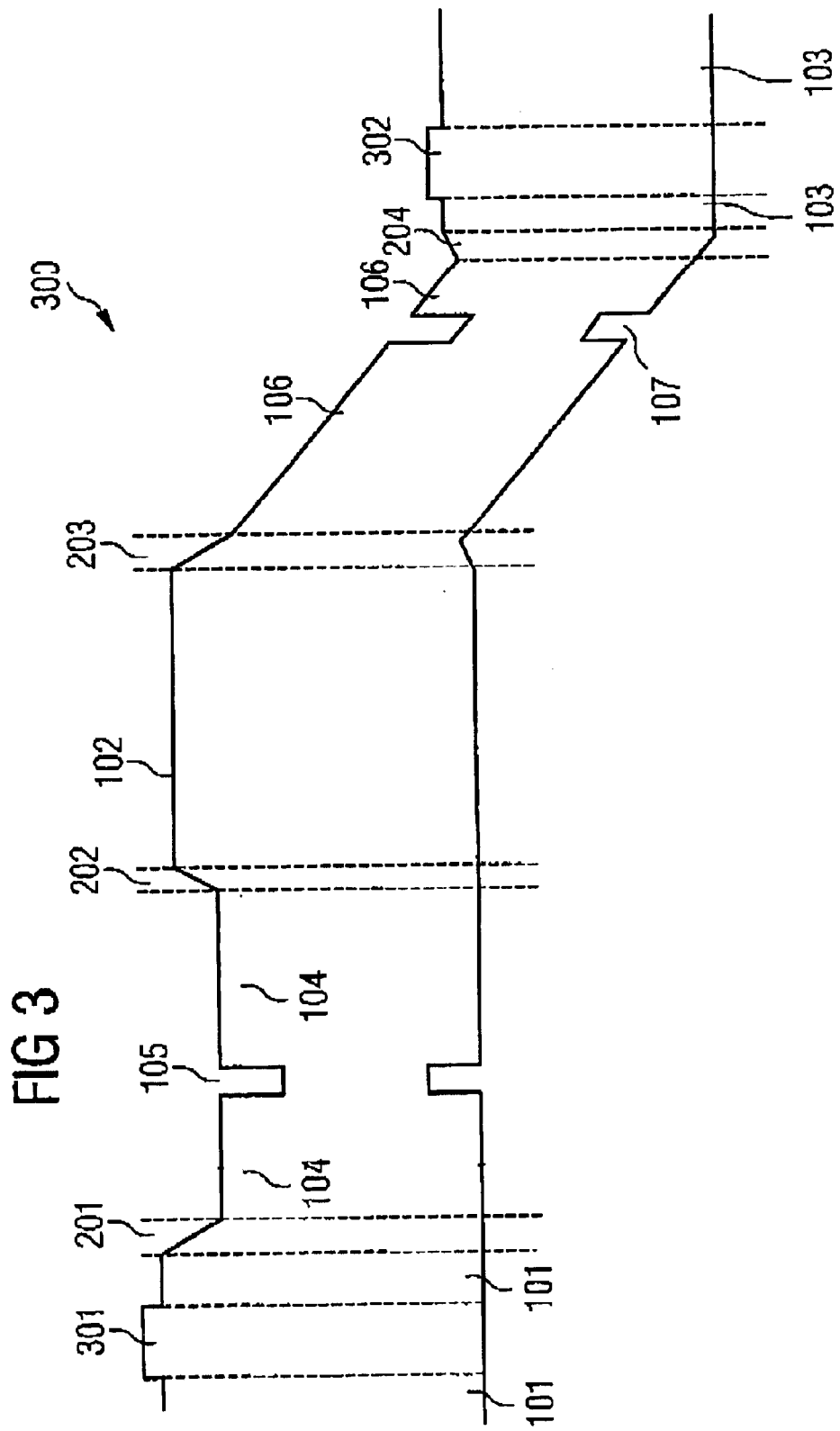
FIG. 3 shows a schematic diagram of the energy bands of an electroabsorption modulator in accordance with a third exemplary embodiment of the invention.

FIG. 3 shows a schematic diagram 300 of the energy bands of an electroabsorption modulator in accordance with a third exemplary embodiment of the invention.

The difference between the electroabsorption modulator in accordance with the third exemplary embodiment and the electroabsorption modulator in accordance with the second exemplary embodiment is explained with the aid of the difference between the schematic diagrams 200 and 300. A selectively oxidizable layer 205 within the middle layer 102 is illustrated in FIG. 2, while FIG. 3 shows the energy bands of an electroabsorption modulator of the two selectively oxidizable layers 301, 302. In each case, one of the two selectively oxidizable layers 301, 302 is arranged at the edge of each of the two n-doped outer lead layers 101, 103.

A reduction in the effective modulator capacitance is also achieved by means of the two selectively oxidizable layers 301, 302. Because of the reduction in the effective modulator capacitance, it is possible to achieve a simplified electrical operation of the electroabsorption modulator, and thus a faster intrinsic modulation of the electroabsorption modulator.

It is possible to achieve an increase in the fraction of the electron filling compared with the hole filling by reducing the spacing of the absorber quantum film 107 from the fourth variation layer 204. This corresponds to a reduced charge carrier transparency density. By contrast with pure BRAQWETs, however, charge carriers of the respective other polarity (here, therefore holes) from the reservoir quantum film 105 are still used for a complete transparency of the electroabsorption modulator. In the borderline case of an n-doped absorber region 106, only low charge carrier densities are required, but the level of the absorption of the electroabsorption modulator is then directly dependent on the level of the input voltage U(t), and this leads to an analogue (non-digital) modulation response of the electroabsorption modulator.

FIG. 4 shows an equivalent electric circuit diagram 400 for an electroabsorption modulator in accordance with the second exemplary embodiment.

An input voltage U(t) is present at the electroabsorption modulator. This is compounded from a bias voltage $U_{bias}$ present at the electroabsorption modulator and an effective modulator voltage $U_{mod}$, which is generated by the generated charge carriers. Both the capacitance effect of the active modulator region and the capacitance effect of the passive modulator region are taken into account for the overall capacitance of the electroabsorption modulator. The ohmic lead resistance of the active modulator region firstly represents an equivalent resistor $R_{sa}$. The charge carrier generation in the absorber region 106 causes a photocurrent $I_{ph}$ between the external connections of the electroabsorption modulator, which overcomes an ohmic resistance $R_p$ during the charge carrier preparation between absorber region 106 and reservoir region 104. The reservoir region 104 and the absorber region 106 are symbolized respectively by means of a capacitor $C_{1a}$, $C_{2a}$. An equivalent resistor $R_{sp}$ represents the ohmic lead resistance of the passive modulator region. The laterally selectively oxidizable layer 205 enclosed by the middle layer 102 is symbolized by means of the capacitors $C_{1p}$, $C_{ox}$ and $C_{2p}$. The capacitance effect of the active and passive modulator regions $C_{mod,act}$ and $C_{mod,pass}$, respectively, can now be calculated from the following equations, taking account of the generated charge carrier quantity ΔQ:

$$C_{mod,act} = \left(\frac{1}{C_{1a}} + \frac{1}{C_{2a}}\right)^{-1} + \frac{\Delta Q}{U_{mod}}, \quad (1)$$

$$C_{mod,pass} = \left(\frac{1}{C_{ox}} + \frac{1}{C_{1p}} + \frac{1}{C_{2p}}\right)^{-1}. \quad (2)$$

The following condition should be satisfied in order to be able to ensure reliable operation of the electroabsorption modulator:

$$C_{mod,pass}R_{sp} < C_{mod,act}(R_{sa} + R_p). \quad (3)$$

The overall capacitance of the electroabsorption modulator $C_{mod}$ is therefore yielded by adding the capacitance effects of the active and the passive modulator regions, which is therefore smaller than the overall capacitance $C_{mod}^c$ of a modulator without a selectively oxidized layer 205:

$$C_{mod} = C_{mod,act} + C_{mod,pass} < C_{mod}^c. \quad (4)$$

The maximum achievable 3 dB cut off frequency $f_{3dB,int}$ for the current modulation of the electroabsorption modulator is therefore yielded in accordance with $$f_{3dB,int} = \frac{1}{2\pi(R_{sa}+R_p)C_{mod,act}} = f_{3dB,int}^0, \quad (5)$$

and is identical to the maximum achievable 3 dB cut off frequency $f_{3dB,int}^0$ without a selectively oxidizable layer 205.

Figure 5:
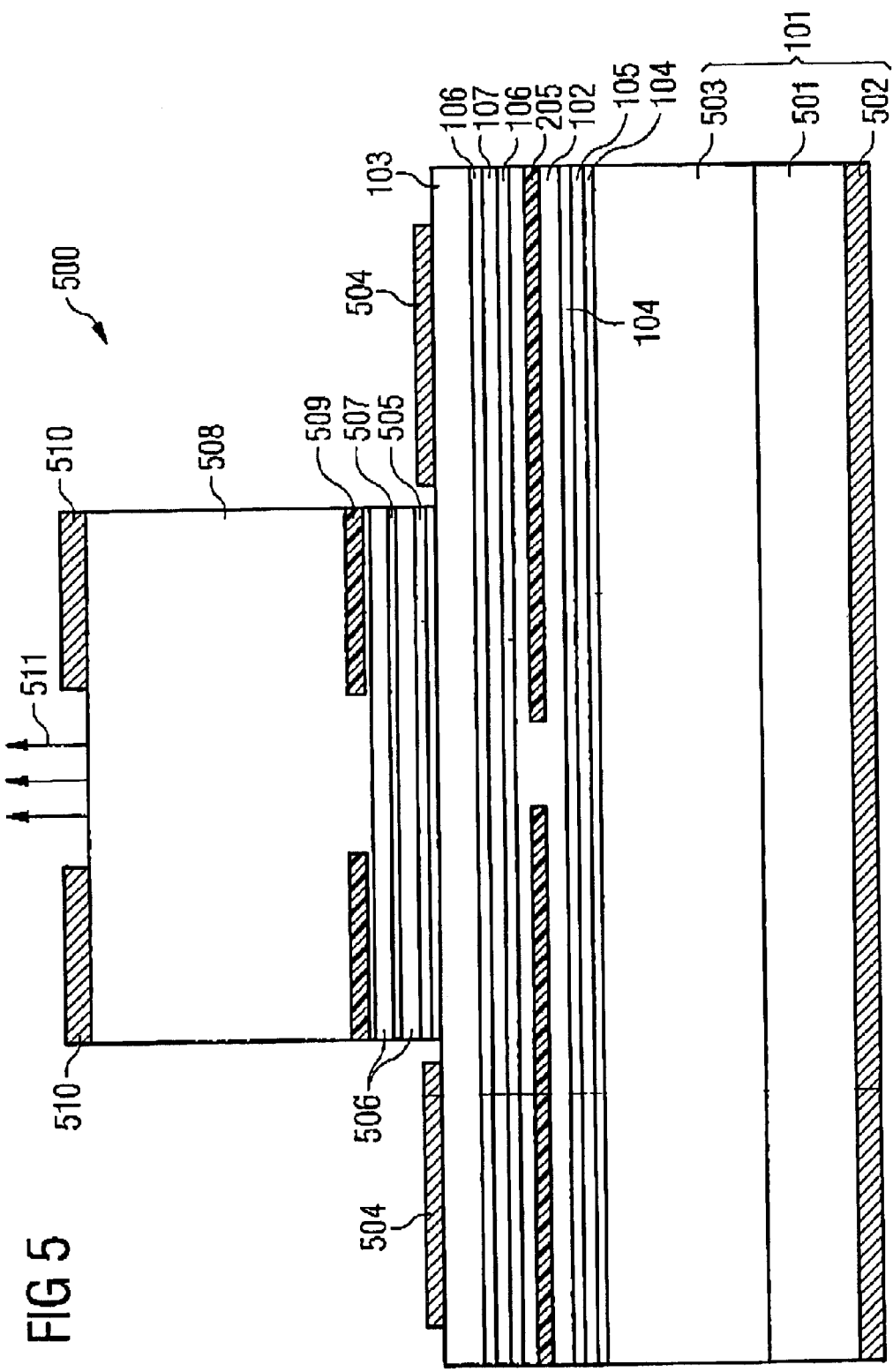
FIG. 5 shows a cross section through a modulator laser device in accordance with a first exemplary embodiment of the invention.

FIG. 5 illustrates a cross section through a modulator laser device 500 in accordance with a first exemplary embodiment of the invention.

The modulator laser device 500 is composed of an electroabsorption modulator 200 in accordance with the second exemplary embodiment, and of a surface-emitting semiconductor laser with vertical resonator (VCSEL). In this case, the electroabsorption modulator 200 is monolithically integrated within the rear reflector of the semiconductor laser. In accordance with the present embodiment of the invention, $Al_xGa_{1-x}As$ is used as basic material for the semiconductor laser and for the electroabsorption modulator 200. This material can have additional constituents such as, for example, indium or nitrogen for producing the individual layers, and/or be n-doped or p-doped in accordance with the requirements.

The modulator laser device 500 firstly has an n-doped substrate 501 with a rear n-contact 502. A plurality of n-doped resonator Bragg reflectors 503 are applied to the n-doped substrate 501. The n-doped substrate 501, the n-contact 502 and the n-doped resonator Bragg reflector 503 together form the first n-doped outer lead layer 101. The following adjoin the main components of the electroabsorption modulator 200: the reservoir region 104 with at least one reservoir quantum film 105, followed by the p-doped middle layer 102 with a selectively oxidized layer 205 for reducing the overall capacitance and the absorber region 106 with at least one absorber quantum film 107. The absorber quantum film 107 and the reservoir quantum film 105 typically each have a thickness of 7 nm. The absorber region 106 and the reservoir region 104 in each case have a layer thickness of the order of magnitude of 120 nm to 150 nm. The layer thickness of the middle layer 102 is of the order of magnitude of 90 nm. Situated above the absorber region 106 is the second n-doped outer lead layer 103, which forms the common ground contact of the semiconductor laser and of the electroabsorption modulator, and is provided with suitable n-contacts 504.

In order to reduce electrical crosstalk between the semiconductor laser and the electroabsorption modulator, the layer conductivity of the second n-doped outer lead layer 103 should be sufficiently high. This can be ensured by means of a suitable doping and an adequate thickness. An additional reflector layer 505 between the active zone of the semiconductor laser and the electroabsorption modulator is provided for setting the desired absorption or photon round trip time. This additional reflector layer 505 influences the optical overlap of the laser modes with the absorber quantum film 107.

Adjoining the additional reflector layer 505 is the active laser zone 506 of the semiconductor laser with a laser quantum film 507 and a plurality of p-doped resonator Bragg reflectors 508 with a current aperture 509, and the laser contacts 510. The laser contacts 510 are arranged in such a way that the laser light 511 emitted by the semiconductor laser and which is influenced by the integrated electroabsorption modulator 200 can leave the modulator laser device 500 perpendicular to the surface.

The semiconductor laser emits laser light at a wavelength of 850 nm. The Bragg resonator of the semiconductor laser has an effective length of 1.8 µm, and the current aperture 509 has a diameter of 6 µm. The current density is of the order of magnitude of 5 kA/cm². The present electroabsorption modulator 200 operates in the range of the loss modulation, which is limited in principle only by the mean photon lifetime in the resonator. This is $\tau_p$=2.94 ps in the system presented.

The emitted wavelength of the semiconductor laser is a function both of the Bragg resonator and of the active laser zone 506. It is possible, for example, to set and modulate efficiently all the wavelengths in the range from approximately 700 nm to approximately 1500 nm by means of a suitable mixing ratio of $Al_xIn_yGa_{1-x-y}As_{1-m-n}Sb_mN_n$ for the active laser zone 506 of the semiconductor laser, and of a similar mixing ratio for the absorber quantum film 107 of the electroabsorption modulator.

The modulator laser device 500 can be produced by means of conventional process methods. The current aperture 509 of the semiconductor laser can be produced both by means of ion implantation and also by means of lateral oxidation or an appropriate combination of lateral oxidation with ion implantation.

Figure 6:
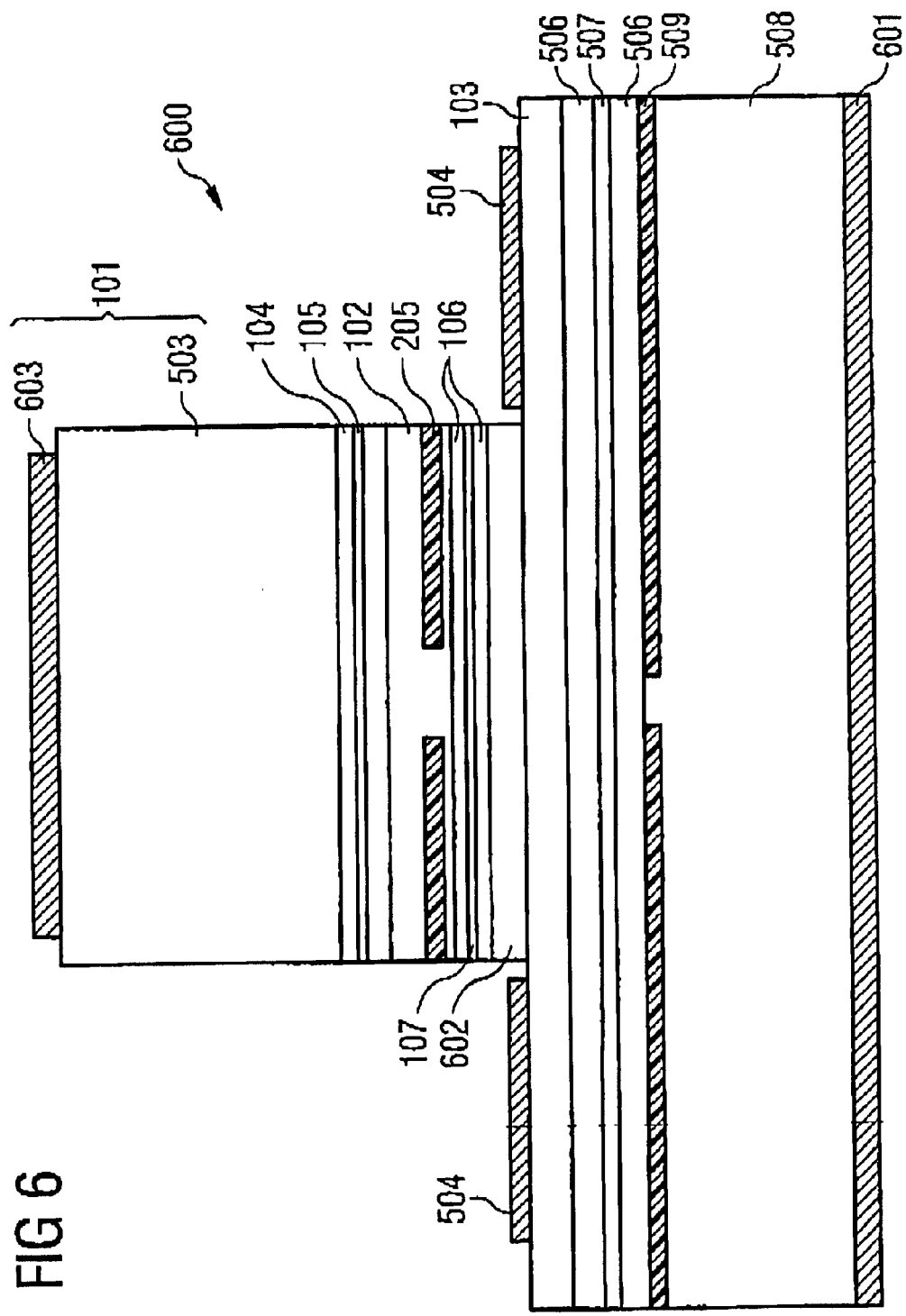
FIG. 6 shows a cross section through a modulator laser device in accordance with a second exemplary embodiment of the invention.

FIG. 6 shows a cross section through a modulator laser device 600 in accordance with a second exemplary embodiment of the invention.

The modulator laser device 600 in accordance with the second exemplary embodiment differs from the modulator laser device 500 in accordance with the first exemplary embodiment essentially in that instead of being arranged, as shown in FIG. 5, below the semiconductor laser the electroabsorption modulator 200 is now arranged above it.

Situated over the entire surface on the rear of the substrate is the p-contact 601, followed by p-doped resonator Bragg reflectors 508 with current aperture 509 and the active laser zone 506 with laser quantum film 507. Arranged there above are the second n-doped outer lead layer 103, which is laterally extended and serves as common ground layer for the electroabsorption modulator 200 and the semiconductor laser, with the n-contacts 504, and a coupling reflector 602 for optically coupling the electroabsorption modulator 200 to the semiconductor laser. These are covered by the modulator region comprised of absorber region 106 with absorber quantum film 107, middle layer 102 with selectively oxidizable layer 205 and reservoir region 104 with reservoir quantum film 105. The "hot" modulator electrode is formed by the n-doped resonator Bragg reflectors 503 and the metal contact 603, which together implement the first n-doped outer lead layer 101.

By comparison with the modulator laser device 500 in accordance with the first exemplary embodiment, the modulator laser device 600 in accordance with the second exemplary embodiment has, inter alia, the advantage of a smaller modulator area, as a result of which the capacitances of the electroabsorption modulator are reduced. However, the production of the semiconductor laser, in particular the current aperture 509, is more complicated because of the required uniformity of the semiconductor laser. The current aperture 509 can, in turn, be produced both by means of oxidation, by means of ion implantation, by means of multiple epitaxy with buried tunnel contact, or by means of a combination of these production methods.

A particular feature of the modulator laser device 600 in accordance with the second exemplary embodiment is that it is also suitable in strip geometry for edge-emitting semiconductor lasers with monolithically integrated electroabsorption modulator. In this case, suitable wave guiding layers then replace the resonator Bragg reflector 503, 508 and the additional reflector layer 505. Depending on the composition of the wave guiding layers, it is possible to select either a coupled waveguide structure or a common waveguide structure for absorber and laser.

Figure 7:
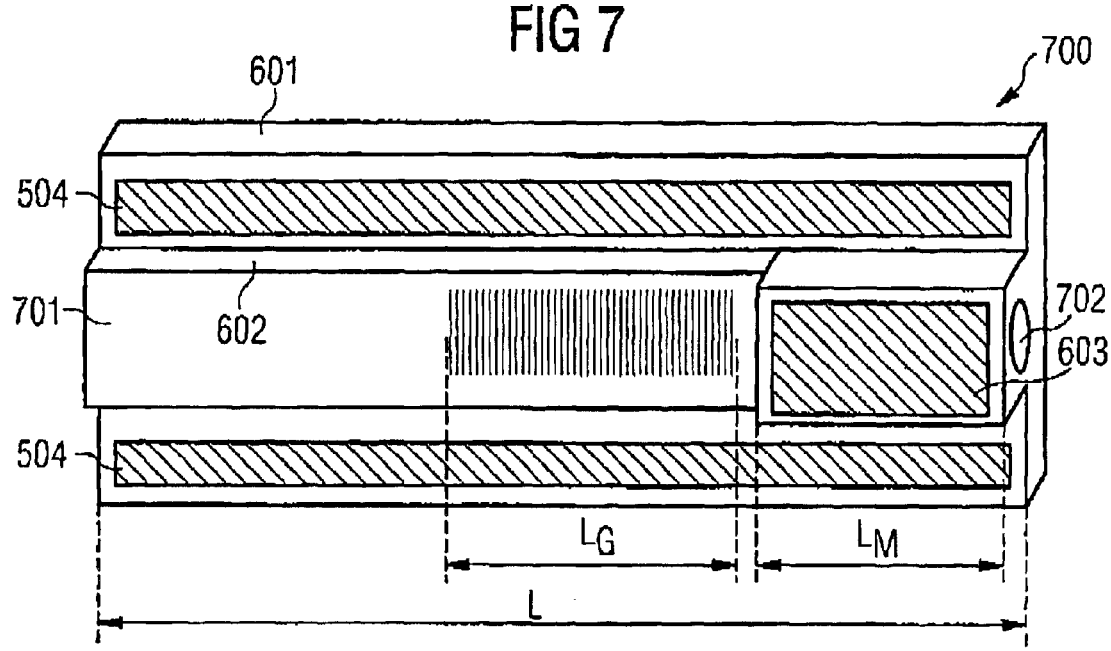
FIG. 7 shows a top view of a modulator laser device in accordance with a third exemplary embodiment of the invention.

FIG. 7 shows a top view of a modulator laser device 700 in accordance with a third exemplary embodiment of the invention.

The modulator laser device 700 combines an edge-emitting semiconductor laser with a monolithically integrated electroabsorption modulator. A coupled waveguide structure for the semiconductor laser and the electroabsorption modulator is preferred in this case. The waveguidance of the semiconductor laser is essentially performed via the additional reflector layer 505, which can be influenced technologically by the type of the resonator grating 701. The emission of the laser light generated by the semiconductor laser and influenced by means of the electroabsorption modulator takes place by means of the emission opening 702 on the coupled waveguide structure.

Given a suitable selection of the waveguide coupling, the position of the resonator grating 701 and its length $L_G$, the overall length L of the modulator laser device 700 and of the modulator length $L_M$, it is also possible to implement semiconductor lasers with a DBR-type or DFB-type laser structure. The decoupling between the electroabsorption modulator and the semiconductor laser can then be optimized by means of the resonator grating for the waves returning from the electroabsorption modulator. A selective oxidation in the lower p-doped resonator Bragg reflector 508 is preferably used to define a current aperture and simultaneous lateral waveguidance for the semiconductor laser.

Figure 8:
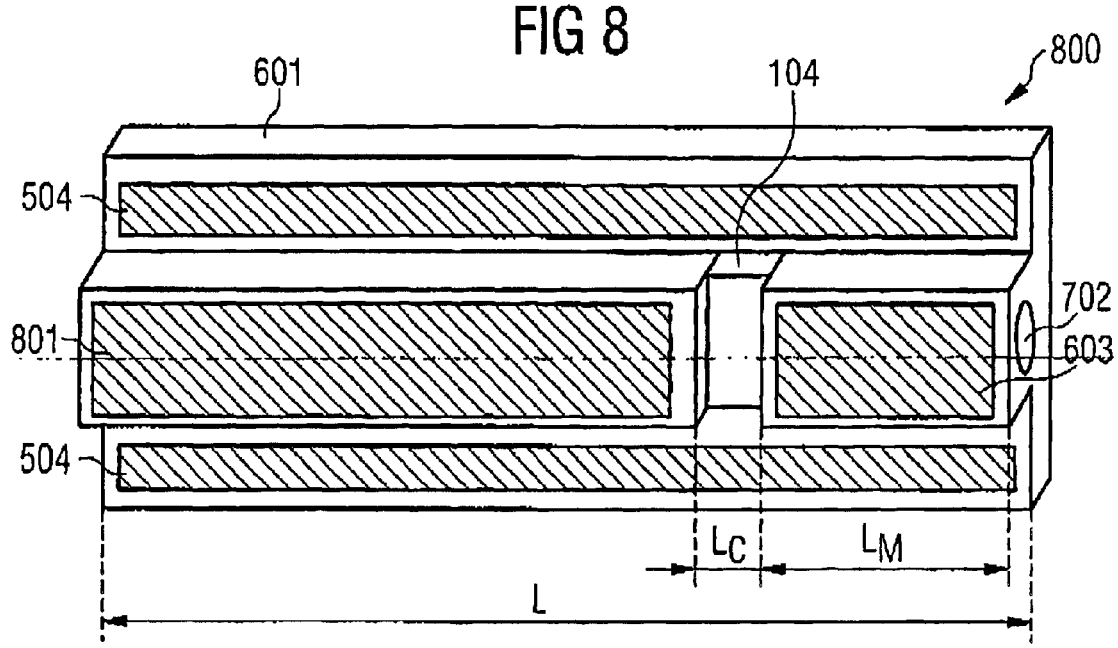
FIG. 8 shows a top view of a modulator laser device in accordance with a fourth exemplary embodiment of the invention.

A top view of a modulator laser device 800 in accordance with a fourth exemplary embodiment of the invention is illustrated in FIG. 8.

By contrast with the modulator laser device 700 in accordance with the third exemplary embodiment, in the modulator laser device 800 in accordance with the fourth exemplary embodiment the electroabsorption modulator 200 comprises two sections which are electrically decoupled from one another, but strongly coupled optically to one another. In this case, a common waveguide is used for the semiconductor laser and the electroabsorption modulator 200, and its optical disturbance on the section $L_C$ in the region of the electric decoupling should be as small as possible. The electric decoupling can be performed, for example, by means of deep etching. The optical coupling can be optimized, for example, by means of antireflection coating or by means of filling in material with a sufficiently high refractive index at the disturbed site.

The optical overlap of the absorber region 106 can be reduced by means of an asymmetric waveguide design. However, the modulator length $L_M$ should then be correspondingly enlarged. Furthermore, the waveguidance within the modulator should be rendered sufficiently strong so that the intensity in the middle layer 102 and in the reservoir region 104 already drops strongly, and thus the disturbance becomes negligibly small over the short section $L_C$. An optional second modulator contact 801 can be provided, for example, with a defined potential in order to switch the passive region, lying there below, of the electroabsorption modulator 200 to be transparent in a defined fashion so that the outcoupling efficiency of the semiconductor laser is not reduced by parasitic absorption.

The following publications are quoted in this document:

[1] P. Steinmann, B. Borchert, B. Stegmutller: "Improved Behaviour of Monolithically Integrated Laser/Modulator by Modified Identical Active Layer Structure", IEEE Photonics Technol. Lett., Vol. 9, No. 12, pp. 1561–1563, 1997

[2] S. F. Lim, J. A. Hudgings, L. P. Chen, G. S. Li, W. Yuen, K. Y. Lau, C. J. Chang-Hasnain; "Modulation of a Vertical-Cavity Surface-Emitting Laser using an Intracavity Quantum-Well Absorber", IEEE Photonics Technol. Lett., Vol. 10, No. 3, pp. 319–321, 1998

[3] J. A. Hudgings, R. J. Stone, C. H. Chang: "Dynamic Behavior and Applications of a Three-Contact Vertical Cavity Surface-Emitting Laser", IEEE J. of sel. Topics in Quantum Electronics, Vol. 5, No. 3, pp. 512–519, 1999

[4] P. J. Bradley, C. Rigo, A. Stano: "Carrier Induced Transient Electric Fields in a p-i-n InP-InGaAs Multiple-Quantum-Well Modulator", IEEE J. of Quantum Electronics, Vol. 32, No. 1, pp. 43–52, 1996

[5] K. W. Jelley, R. W. H. Engelmann, K. Alavi, H. Lee: "Well Size Related Limitations on Maximum Electroabsorption in GaAs/AlGaAs Multiple Quantum Well Structures", Appl. Phys. Lett., Vol. 55, No. 1, pp. 70–72, 1989

[6] M. Preisel, J. Mork: "Phonon-Mediated Carrier Capture in Quantum Well Lasers", J. Appl. Phys., Vol. 76, No. 3, pp. 1691–1696, 1994

[7] M. Wegener, J. E. Zucker, T. Y. Chang, N. J. Sauer, K. L. Jones, D. S. Chemla: "Absorption and Refraction Spectroscopy of a Tunable-Electron-Density Quantum-Well and Reservoir Structure", Phys. Rev. B., Vol. 41, No. 5, pp. 3097–3104, 1990

[8] J. Wang, J. P. Leburton, J. L. Educato, J. E. Zucker: "Speed Response Analysis of an Electron-Transfer Multiple-Quantum-Well Waveguide Modulator", J. Appl. Phys., Vol. 73, No. 9, pp. 4669–4679, 1993

[9] N. Agrawal, M. Wegener: "Ultrafast Graded-Gap Electron Transfer Optical Modulator Structure", Appl. Phys. Lett., Vol. 65, No. 6, pp. 685–687, 1994

[10] EP 1 069 456 A2
[11] DE 692 03 998 T2
[12] DE 44 29 772 C2
[13] DE 690 15 228 T2
[14] EP 0 599 826 B1

What is claimed is:

1. Electroabsorption modulator comprising:
   a layer sequence of at least five layers, the layer sequence comprising sequentially a first layer with excess charge carriers of a first charge carrier type, a second layer without excess charge carriers, a third layer with excess charge carriers of a second charge carrier type, a fourth layer without excess charge carriers, and a fifth layer with excess charge carriers of the first charge carrier type;

at least one light absorption layer which is arranged between the first layer and the third layer and is set up to generate charge carriers upon irradiation of light of a specific wavelength;

at least one storage layer which is arranged between the third layer and the fifth layer and is set up to store charge carriers; and at least one laterally extended insulating layer with a central opening incorporated in the first layer or the third layer or the fifth layer for limiting the current flow through the layer sequence and thus for defining an active modulator region in which laser light to be modulated overlaps with the active modulator region.

2. Electroabsorption modulator according to claim 1, wherein the first layer, the third layer and the fifth layer of the layer sequence are appropriately doped to generate the respective excess charge carriers.

3. Electroabsorption modulator according to claim 1, wherein the light absorption layer and the storage layer each have at least one at least one-dimensional quantum system.

4. Electroabsorption modulator according to claim 1, wherein the first layer and the fifth layer are electrically coupled in each case to an electrode, and in which a current flow through the layer sequence is laterally bounded by the insulating layer.

5. Electroabsorption modulator according to claim 1, wherein the insulating layer is sheathed by the third layer.

6. Electroabsorption modulator according to claim 1, wherein the insulating layer is an oxidized part of the third layer.

7. Modulator laser device comprising:

a semiconductor laser; and an electroabsorption modulator, said electroabsorption modulator comprising:

a layer sequence of at least five layers, the layer sequence comprising sequentially a first layer with excess charge carriers of a first charge carrier type, a second layer without excess charge carriers, a third layer with excess charge carriers of a second charge carrier type, a fourth layer without excess charge carriers, and a fifth layer with excess charge carriers of the first charge carrier type, at least one light absorption layer which is arranged between the first layer and the third layer and is set up to generate charge carriers upon irradiation of light of a specific wavelength, at least one storage layer which is arranged between the third layer and the fifth layer and is set up to store charge carriers, and at least one laterally extending insulating layer with a central opening incorporated in the first layer or the third layer or the fifth layer for limiting the current flow through the layer sequence and thus for defining an active modulator region in which laser light to be modulated overlaps with the active modulator region, and wherein the electroabsorption modulator and the semiconductor laser are arranged in such a way that the electroabsorption modulator can transmit or absorb light emitted by the semiconductor laser.

8. Modulator laser device according to claim 7, wherein the electroabsorption modulator and the semiconductor laser have at least one common electrically conductive connecting layer which is set up in such a way that a common current flow is avoided both through the electroabsorption modulator and through the semiconductor laser.

9. Modulator laser device according to claim 7, wherein the electroabsorption modulator and the semiconductor laser are monolithically integrated on a semiconductor substrate.

10. Modulator laser device according to claim 7, wherein the semiconductor laser is a vertically emitting laser, and wherein the electroabsorption modulator and the semiconductor laser are arranged vertically one above another.

11. Modulator laser device according to claim 7, wherein the semiconductor laser is an edge-emitting laser, and wherein the electroabsorption modulator and the semiconductor laser are arranged laterally next to one another.

12. Modulator laser device according to claim 7, wherein the edge-emitting laser comprises a resonator based on Bragg structures.

13. Method for producing an electroabsorption modulator, said method comprising:

producing a layer sequence of at least five sequential layers on a substrate;

producing at least one laterally extended insulating layer with a central opening in the first layer or the third layer or the fifth layer for limiting the current flow through the layer sequence and thus for defining an active modulator region in which laser light to be modulated overlaps with the active modulator region, introducing excess charge carriers of a first charge carrier type into the first layer and into the fifth layer of the layer sequence, introducing excess charge carriers of a second charge carrier type into the third layer of the layer sequence, introducing no excess charge carriers into the second layer and into the fourth layer of the layer sequence, and electrically coupling both the first layer and the fifth layer of the layer sequence to at least one electric connection in order to form an electroabsorption modulator.

* * * * *